United States Patent
Doshi et al.

(10) Patent No.: US 6,277,720 B1
(45) Date of Patent: *Aug. 21, 2001

(54) SILICON NITRIDE DOPANT DIFFUSION BARRIER IN INTEGRATED CIRCUITS

(75) Inventors: Vikram N. Doshi; Takayuki Niuya, both of Plano; Ming Yang, Richardson, all of TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/095,432

(22) Filed: Jun. 10, 1998

Related U.S. Application Data

(60) Provisional application No. 60/051,287, filed on Jun. 30, 1997.

(51) Int. Cl.$^7$ ................... H01L 21/337; H01L 21/3205; H01L 21/302
(52) U.S. Cl. ................... 438/586; 438/195; 438/196; 438/399; 438/587; 438/621; 438/706; 438/738; 438/743; 438/744; 438/791
(58) Field of Search ................... 438/586, 587, 438/593, 599, 181, 195, 533, 196, 571, 621, 706–710, 738–744, 241, 783, 256, 791, 393–399

(56) References Cited

U.S. PATENT DOCUMENTS

| | | | |
|---|---|---|---|
| 4,466,172 | * 8/1984 | Batra | 29/571 |
| 5,302,236 | * 4/1994 | Tahara et al. | 156/643 |
| 5,595,627 | * 1/1997 | Inazawa et al. | 156/643.1 |
| 5,663,092 | * 9/1997 | Lee | 438/253 |
| 5,700,737 | * 12/1997 | Yu et al. | 438/636 |
| 5,780,331 | * 7/1998 | Liaw et al. | 438/238 |
| 5,885,895 | * 3/1999 | Lin et al. | 438/637 |
| 5,997,757 | * 12/1999 | Nagayama et al. | 216/38 |
| 6,060,352 | * 5/2000 | Sekiguchi | 438/253 |

* cited by examiner

Primary Examiner—John F. Niebling
Assistant Examiner—Ha Tran Nguyen
(74) Attorney, Agent, or Firm—Robby T. Holland; Wade James Brady, III; Frederick J. Telecky, Jr.

(57) ABSTRACT

A method of fabricating an integrated circuit, and an integrated circuit so fabricated, is disclosed. A silicon dioxide layer (14) that is doped with both boron and phosphorous, typically referred to as BPSG, is used as a planarizing layer in the integrated circuit structure, above which conductive structures (46, 52, 54) are disposed. A silicon nitride layer (30) is in place below the BPSG layer (14), and serves as a barrier to the diffusion of boron and phosphorous from the BPSG layer (14) during high temperature processes such as reflow and densification of the BPSG layer (14) itself. Contact openings (PC, BLC, CT) are etched through the BPSG layer (14) and the silicon nitride layer (30) using a two-step etch process. The first etch selectively etches silicon dioxide relative to silicon nitride, and thus stops on silicon nitride layer (30); besides serving as an etch stop, silicon nitride layer (30) protects underlying active regions (6, 7) from damage that may be caused by ionized oxygen released during oxide etch. A brief nitride etch is then used to clear silicon nitride layer (30), without damaging corner locations (NC) of the sidewall structures (11).

15 Claims, 15 Drawing Sheets

US 6,277,720 B1

SILICON NITRIDE DOPANT DIFFUSION BARRIER IN INTEGRATED CIRCUITS

CROSS-REFERENCE TO RELATED APPLICATIONS

This application claims priority under 35 USC § 119 (e)(1) of provisional application No. 60/051,287 filed Jun. 30, 1997.

STATEMENT REGARDING FEDERALLY SPONSORED RESEARCH OR DEVELOPMENT

Not applicable.

BACKGROUND OF THE INVENTION

This invention is in the field of semiconductor integrated circuits, and is more specifically directed to the manufacture of such integrated circuits.

Recent advances in the field of integrated circuit processing continue to greatly increase device densities, and thus the functionality, of integrated circuit devices. For example, metal-oxide semiconductor field-effect transistor (MOSFET) channel lengths of $0.50\mu$ and smaller are now commonplace in very large scale integration (VLSI) integrated circuit devices such as dynamic random access memories (DRAMs) and microprocessors. The continued scaling of photolithographic critical dimensions (i.e., widths of patterned conductive elements and contacts) to achieve these high device densities also require scaling of element thicknesses; in particular, junction depths in MOSFET transistors with $0.5\mu$ channel lengths and smaller are typically on the order of $0.30\mu$.

In addition to these extremely small device dimensions now being used in modern integrated circuits, multiple levels of conductors are now used to interconnect the ever-increasing number of active devices, and thus obtain the highly integrated functionality. For example, three levels of metal interconnection, in addition to lower level polysilicon-based gate level interconnects, are now common in VLSI circuits such as DRAMs and microprocessors. These multiple levels of metal interconnection not only increase the complexity of contact placement and location, but also necessitate the formation of highly planar top surfaces of insulating layers, to permit the deposition of high integrity metal films (i.e., without discontinuities at steps). In addition, the planarization of films has recently become essential in the patterning of the metal films and contact openings, due to the limited depth of field provided by conventional photolithographic equipment of submicron resolution.

In addition to multiple levels of metalliation, insulating layers with highly planar surfaces are also necessary for complex capacitor structures as used in modern DRAMs. For example, the fabrication of capacitor structures that in part overlie planarized insulating layers, is known in the art. Attention is directed in this regard to commonly assigned copending application Ser. 08/845,755, filed Apr. 25,1997, entitled "A Silicon Nitride Sidewall and Top Surface Layer Separating Conductors"for a description of the fabrication of such capacitors in a DRAM integrated circuit As is fundamental in the art, chemical vapor deposition of doped silicon dioxide is commonly used to form insulating layers in semiconductor integrated circuits. These oxide films are typically doped with both phosphorous and boron, and as such are commonly referred to as "BPSG", for boro-phospho-silicate glass. Doped oxide films are particularly attractive in the formation of oxide films with planar top surfaces, as the presence of the dopants in silicon dioxide causes these films to flow (i.e., "reflow") and densify when subjected to a high temperature anneal. As such, BPSG films are commonly used as planarized insulating films, particularly to underlie a metal conductor layer.

Referring first to FIG. 1, a cross-section of a conventional integrated circuit will now be described. In this example, both p-channel MOSFETs and n-channel MOSFETs are utilized, and as such the conventional integrated circuit of FIG. 1 is fabricated according to complementary-MOS (CMOS) technology. Substrate 2 is p-type in this example. N-channel transistors are formed within a double well structure that includes n-type deep well 3, within which lightly-doped p-type well 9 is formed; conversely, p-channel transistors are formed within lightly-doped n-type well 4. The integrated circuit of FIG. 1 is a dynamic random access memory in this example, in which p-well 9 defines the location of memory cells, and n-well 4 defines the location of p-channel periphery transistors; n-channel periphery transistors will also be implemented in similar fashion as those in wells 3, 9, but are not shown in FIG. 1 for the sake of clarity. Field oxide structures 5, formed by LOCOS (local oxidation of silicon) serve as source/drain isolation in the usual manner.

Gate structures 10 are disposed at various locations of the surface of the structure, and are constructed in the usual manner, overlying gate oxide layer 8 to define the channel region of the transistor devices. In modern high-performance integrated circuits, gate structures 10 are fabricated as multilayer structures of polysilicon and a metal silicide, such as tungsten disilcide, to provide the necessary conductivity, particularly in gate structures 10 of submicron widths. P-type source/drain regions 6 and n-type source/drain regions 7 are formed into their respective wells 4, 9, in a self-aligned manner relative to. gate structures 10 as is conventional in the art. In this example, each of gate structures 10 include, sidewall filaments 11, formed of an insulating material such as silicon dioxide or silicon nitride; sidewall filaments 11 are used to define lightly-doped source/drain extension 6', 7' thereunder, as shown in FIG. 1.

In the example of FIG. 1, planarizing silicon dioxide film 14 is disposed over the surface of the structure, with undoped oxide film 12 disposed therebeneath. Undoped oxide film 12, in this conventional example, is formed by way of chemical vapor deposition utilizing the decomposition of tetraethyloxysilane (TEOS), to a thickness of on the order of 500 Å, and is conformal to the various structures (e.g., gate structures 10, sidewall filaments 11, and field oxide structures 5). Planarizing oxide film 14, on the other hand, is deposited by way of CVD with phosphorous and boron, to a thickness of on the order of 5000 Å. Following deposition, the structure is subjected to a high temperature anneal to reflow and densify BPSG film 14; an etchback is then performed to planarize BPSG film 14 as illustrated in FIG. 1.

Following the processing described hereinabove to form the structure illustrated in FIG. 1, contact openings are then typically defined by way of photolithography and etched through films 12, 14 to expose locations of gate structures 10, and source/drain regions 6, 7 to which contact is desired to be made. The surface of BPSG film 14 is then suitable for deposition of a metal conductor layer thereover, either making contact itself through the etched contact openings, or by way of conductive plugs of polysilicon or refractory metal that may be first formed into the contact openings.

The purpose of undoped oxide film 12 is to serve as a barrier to boron and phosphorus dopant contained within BPSG film 14, preventing the diffusion of these species into source/dram regions 6, 7 as may occur in subsequent high temperature processes as reflow of BPSG film 14 and the like. As is fundamental in the art, diffusion of dopant from BPSG film 14 into the active devices is undesirable, as excess boron and phosphorous will either counterdope source/drain regions 6, 7 (for diffusing dopant of opposite conductivity type) or drive deeper the junctions of source/drain regions 6, 7. Each of these effects reduce device performance significantly, either through increasing source/drain resistance, or through increasing junction capacitance.

In addition, diffusion of dopant from BPSG film 14 is also deleterious to film 14 itself. In particular, voids in BPSG film 14 have been observed, and are believed to be caused to diffusion of phosphorous out of the film. Such voids are, of course, hazards to yield and reliability of the integrated circuit.

As device sizes are scaled smaller, however, it has been observed that undoped oxide film 12 is incapable of preventing dopant diffusion from BPSG film 14, especially as its thickness falls much below 500 A. Increasing the thickness of undoped oxide film 12 to improve its barrier capability is not an attractive option in very dense integrated circuits, however. Attention is directed to bit line location BLC of FIG. 1 in this regard. Bit line location BLC indicates the location at which, in a DRAM, a polysilicon conductive plug is to be placed to make contact to source/drain region 7 thereunder; as is evident from FIG. 1, the width of bit line location BLC is very narrow. Given that undoped oxide film 12 is conformal to gate structures 10 as deposited, the small spacing of bit line location BLC presents a limitation to the thickness of undoped oxide film 12, because an overly thick oxide film 12 will not fill the opening between these two gate structures 10. Similar problems are present at plug contact locations PC of FIG. 1, at which polysilicon plugs for contacting overlying cell capacitors to the underling source/drain regions 7 are to be formed.

By way of further background, silicon nitride is a known barrier to the diffusion of boron and phosphorous. However, referring back to FIG. 1, the use of undoped oxide film 12 as the diffusion barrier has long been preferred, as oxide film 12 may be readily etched in the same step as used to etch BPSG film 14. In addition, difficulties in the etch of conformal nitride layers have also been observed, particularly in the overetching and degradation of the nitride film at the upper corners of structures such as gate structures 10 in FIG. 1. Attention in this regard is directed to commonly assigned copending application Ser. 08/845,755, filed Apr. 25,1997, entitled "A Silicon Nitride Sidewall and Top Surface Layer Separating Conductors", incorporated herein by this reference, which describes the fabrication of gate structures having silicon nitride sidewalls and top layers. Accordingly, the use of silicon nitride as a diffusion barrier in structures such as those illustrated in FIG. 1 has long been discouraged.

By way of still further background, two-step etches to clear silicon nitride residue are known in the art. As is well known in the art, silicon nitride is often used as sidewall filaments along gate structures, so that graded junction doping according to the "lightly-doped drain" technique may be performed in a self-aligned manner. These silicon nitride sidewall filaments are conventionally formed by CVD of silicon nitride overall, followed by an anisotropic nitride etch to remove the nitride from the flat active regions, leaving sidewall filaments behind. However, silicon nitride residue from the formation of sidewall filaments has been observed at the so-called "bird's-beak" locations, at the margins of the field oxide structures, as these structures also have slight sidewalls along which nitride may be left following anisotropic etch. This residue can deleteriously affect contact openings that may be formed at these locations; as such, a conventional contact etch process includes a first step to etch through overlying oxide, such as BPSG, and a short nitride etch to then clear any silicon nitride residue that may still remain.

BRIEF SUMMARY OF THE INVENTION

The present invention may be incorporated into the fabrication of an integrated circuit structure, and an integrated circuit structure so fabricated, by including a silicon nitride diffusion barrier layer underlying a planarizing doped oxide layer. The silicon nitride layer is substantially conformal to structures such as gate structures and field isolation structures. Etching of contact openings through the combination of the doped. oxide layer and the silicon nitride layer may be accomplished by way of a two-step process.

It is an object of the present invention to provide a method of fabricating an integrated circuit, and an integrated circuit so fabricated, in which dopant in planarizing insulating films is prevented from diffusing into the active regions of the integrated circuit.

It is a further object of the present invention to provide such a method and integrated circuit which is particularly well suited for extremely small, submicron, geometries.

It is a further object of the present invention to provide such a method and integrated circuit in which breakdown of the conformal diffusion barrier layer at upper corners of the underlying structures is prevented.

It is a further object of the present invention to provide such a method that is suitable for use in the fabrication of high density memories, such as DRAMs.

It is a further object of the present invention to provide such a method and integrated circuit in which shallow source/drain junctions may be maintained.

It is a further object of the present invention to provide such a method and integrated circuit in which the silicon nitride layer protects the underlying active regions from being damaged by ionized oxygen that is released during the etch of the overlying doped oxide layer.

Other objects and advantages of the present invention will be apparent to those of ordinary skill in the art having reference to the following specification together with its drawings.

BRIEF DESCRIPTION OF THE SEVERAL VIEWS OF THE DRAWING

FIG. 2b is an electrical diagram, in schematic form, of circuit elements illustrated in a portion of integrated circuit 20 as shown in FIG. 2a.

FIG. 2c is a plan view of a portion of the partially fabricated integrated circuit of FIG. 2a.

FIGS. 3a through 3k are cross-sectional diagrams illustrating various process steps performed in the fabrication of the integrated circuit of FIG. 2a.

DETAILED DESCRIPTION OF THE INVENTION

Figure 1:
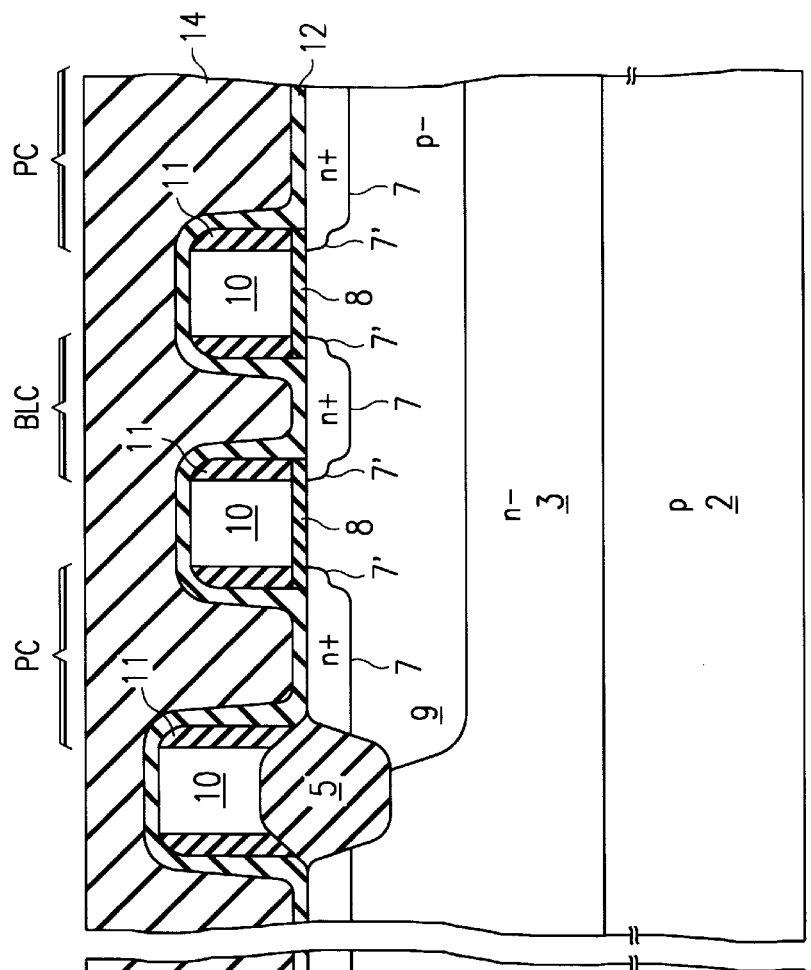
FIG. 1 is a cross-sectional diagram of a partially fabricated integrated circuit according to the prior art.
Figure 1:
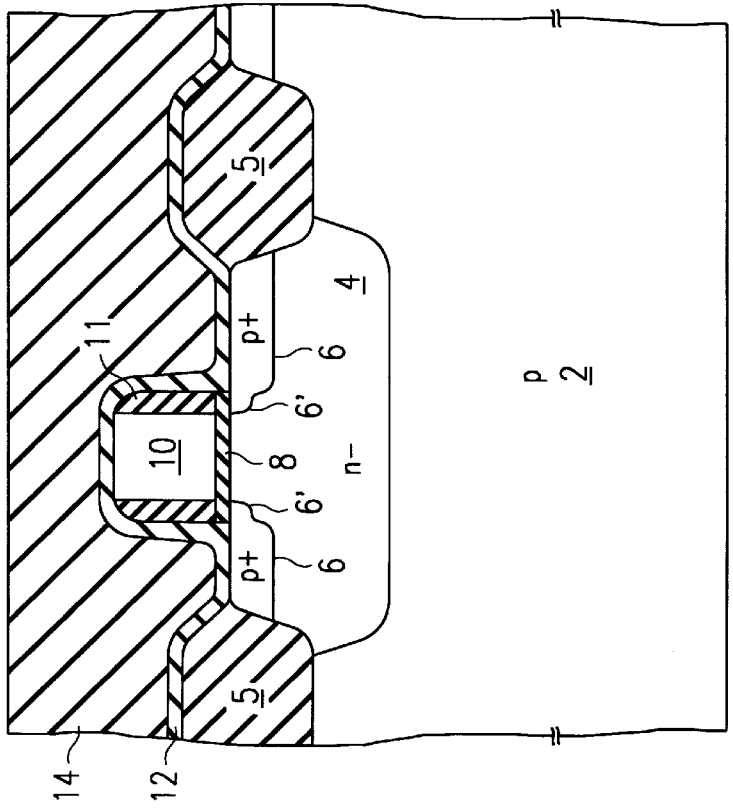
Figure 2A:
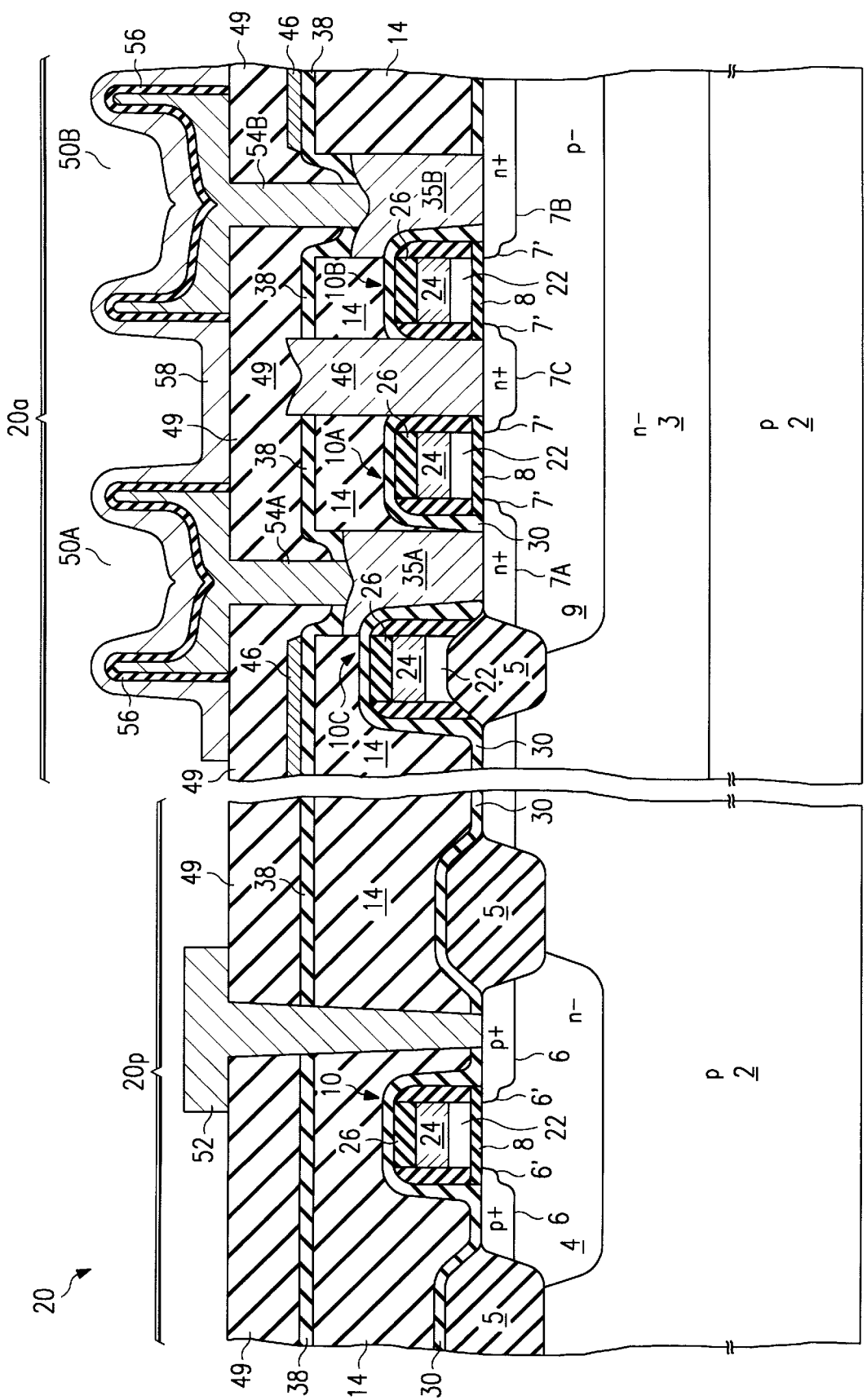
FIG. 2a is a cross-sectional diagram of an integrated circuit according to the preferred embodiment of the invention.

Referring first to FIG. 2a, a cross-sectional view of portions of partially-fabricated integrated circuit 20 constructed according to the preferred embodiment of the present invention will now be described. Similar elements as previously described relative to FIG. 1 are illustrated in FIG. 2a (and the remaining Figures) using the same reference numerals, for convenience and clarity. Integrated circuit 20 in this example is a dynamic random access memory (DRAM), constructed according to complementary metal-oxide-semiconductor (CMOS) technology. As will become apparent from the following description, the present invention is particularly beneficial in integrated circuits such as DRAM integrated circuit 20 of FIG. 2a, which implements complex structures above and insulated from the active devices in the semiconductor bulk, and which therefore require highly planarized insulating layers for manufacturability. However, it is contemplated that the present invention will also be beneficial in integrated circuits of other types, including logic circuits such as microprocessors and digital signal processors, and in integrated circuits fabricated according to other technologies including bipolar, BiCMOS, and single channel-type (e.g., n-channel) MOS, either in bulk silicon or in silicon-on-insulator (SOI) semiconductor material.

FIG. 2a illustrates two portions of partially-fabricated integrated circuit 20, namely array portion 20a and periphery portion 20p. Specifically, periphery portion 20p as shown in FIG. 2a includes a p-channel transistor, with the current between source/drain regions 6 controlled by a voltage applied to gate structure 10 therein, vertically separated from the channel region between source/drain regions 6 by gate oxide 8; of course, n-channel periphery transistors will also be implemented in periphery portion 20p, within a p-type well, but are not shown in FIG. 2a (and FIG. 2c) for the sake of clarity. Similarly as described hereinabove, p-channel source drain regions 6 are disposed within n-well 4 at locations defined by field isolation oxide structures 5. Well 4 is a lightly-doped n-type region formed at a surface of substrate 2. Gate structure 10 is preferably implemented as a multiple-layer structure for improved conductivity, as will be described hereinbelow. In this example, a series of insulating layers including nitride layer 30, doped oxide (BPSG) layer 14, oxide layer 38, and insulating layer 49 (which itself may be constructed of multiple layers of insulating material, if desired) overlie gate structure 10. Metal conductor 52 makes contact to one of source/drain regions 6, through a contact opening CT etched through overlying insulating layers 49, 38, 14, 30. Of course, additional metallization layers will likely also be used in integrated circuit 20, physically and electrically insulated from one another, by additional insulating layers, in the conventional manner; for example, three levels of metallization are now commonly used in the art.

Array portion 20a of integrated circuit 20 contains, in the portion illustrated in FIG. 2a, two storage capacitors 50A, 50B which are formed in a "crown" fashion, as described in further detail in commonly assigned copending application Ser. 08/845,755, filed Apr. 25, 1997, entitled "A Silicon Nitride Sidewall and Top Surface Layer Separating Conductors"incorporated hereinabove by reference. In this example, storage capacitors 50 are formed by field plate 58 that is coupled to a fixed voltage, and separated from individual second plates 54A, 54B by capacitor dielectric layer 56. Each of plates 54, 58 are preferably formed of polysilicon, while capacitor dielectric layer 56 is preferably formed as a sandwich structure of silicon dioxide and silicon nitride, as known in the DRAM art. Plates 54A, 54B are respectively connected to polysilicon plugs 35A, 35B which, as will be described in further detail hereinbelow, are formed of multiple polysilicon layers.

Polysilicon plugs 35 are each in contact with n+ source/drain regions 7 at the surface of p-type well 9; the location of source drain regions 7 are defined by field oxide structures 5 and gate structures 10A through 10C (collectively referred to as gate structures 10), similarly as discussed above. Well 9 is formed within deep n-type well 3, at a surface of p-type substrate 2. Bit line 46 is formed of polysilicon, preferably clad with a silicide film for improved conductivity, and is in contact with a source/drain region 7C; in this example, bit line 46 extends laterally in the cross-sectional view of FIG. 2a, and as such continuously extends above BPSG layer 14 as illustrated in Figure 2a. Source/drain region 7C is selectively connected to source/drain regions 7A, 7B, connected to plugs 35A, 35B respectively, by the voltages applied to gate structures 10A, 10B, respectively, serving as word lines. In FIG. 2a, the gate structure 10C in array portion 20a is disposed over field oxide structure 5, as it serves as a word line for capacitors other than those shown in FIG. 2a. In similar fashion, gate structures 10A, 10B, 10C extend for some distance along array portion 20a (i.e., into and out of the page of FIG. 2a), to control connection of multiple storage capacitors 50 to their respective bit lines, in the usual manner for DRAMs.

Figure 2B:
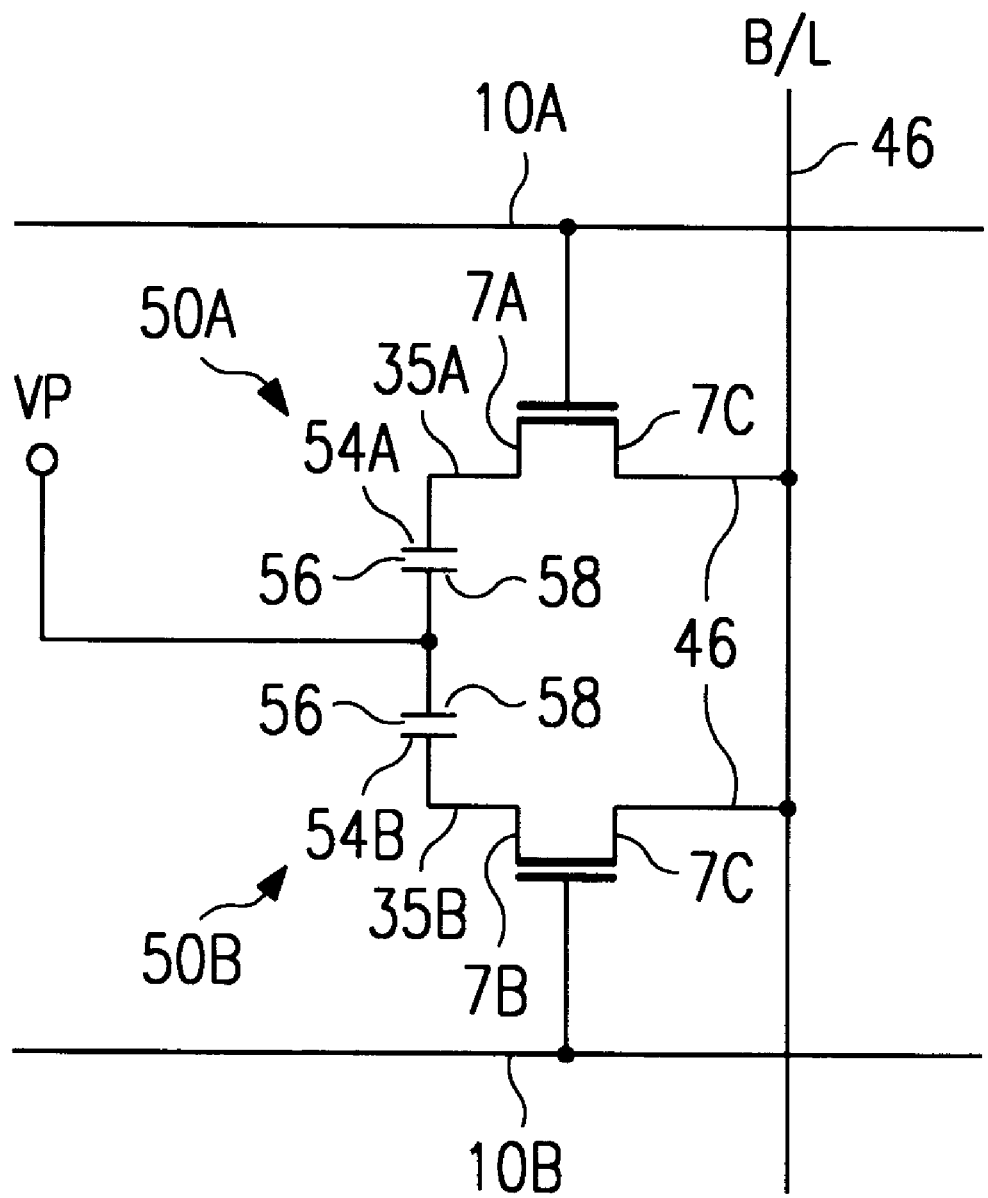

FIG. 2b illustrates the electrical interconnection of the elements of array portion 20a in FIG. 2a. Field plate 58 is biased to a fixed plate voltage $V_p$, which may be $V_{cc}$, ground, or some intermediate voltage, depending upon the maximum voltage to be applied across capacitors 50A, 50B. Plates 54A, 54B, each separated from plate 58 by capacitor dielectric film 56, are connected to source/drain regions 7A, 7B, respectively, via plugs 35A, 35B. Transistor gates 10A, 10B serve as word lines, and selectively place their respective source/drain regions 7A, 7B in conductive connection with source/drain region 7C. Source/drain region 7C is connected to bit line 46, which in turn is connected to a sense amplifier (not shown) in the usual manner for DRAMs.

In operation, for the example of FIG. 2b, one of storage capacitors 50A, 50B may be selected for read or write access. This selection is accomplished by one of word lines 10A, 10B being driven to a voltage sufficiently above the threshold voltage so that its corresponding source/drain region 7A, 7B is effectively connected to source/drain region 7C, and thus to bit line 46. In this state, the selected plate 54A, 54B is connected to bit line 46 through its corresponding plug 35A, 35B, source/drain region 7A, 7B, and by operation of its gate structure 10A, 10B in causing a channel to source/drain region 7C.

Of course, millions of storage capacitors, or storage cells, 50 are present in a modern DRAM, arranged in rows and columns. In the conventional manner, a row of storage cells are selected by a word line, with each cell in the selected row connected to the bit line corresponding to the column within which the cell resides. It is contemplated that the structures illustrated in FIG. 2a are suitable for use in DRAM integrated circuits of 64 Mbit and greater sizes. In these applications, the feature sizes will, of course, be very small. For example, it is contemplated that channel lengths (i.e., the widths of gate structures 10 in the orientation of FIG. 2a) will be on the order of $0.35\mu$ or less, and that the junction depths of source/drain regions 6, 7 Will be on the order of $0.30\mu$. These extremely small critical dimensions not only result in high density and high performance integrated circuit operation, but also involve significant sensitivity to process variations and parameters.

Figure 2C:
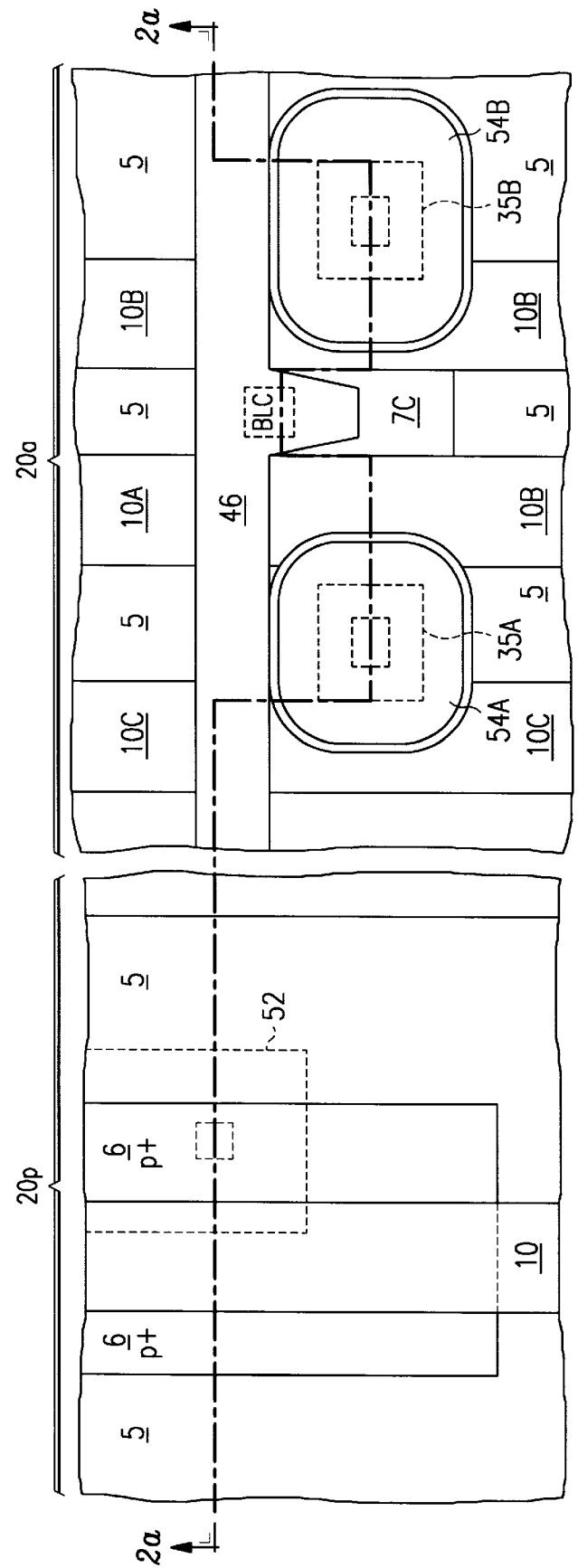

FIG. 2c illustrates periphery portion 2p and array portion 20a in plan view. As shown in FIG. 2c, periphery portion 20p is a simple p-channel MOS transistor, with gate structure 10 extending laterally, above field oxide structure 5. As. noted above, n-channel periphery transistors will also be implemented in periphery portion 20p, but are not shown in FIG. 2c for the sake of clarity. Source/drain regions 6 are defined by field oxide structure 5 and gate structure 10, in the conventional manner. Metal conductor 52 is illustrated in shadow, as making contact to one of source/drain regions 6 and then extending away from the portion for: connection to circuitry in the desired manner.

Two storage nodes, corresponding to capacitor plates 54A, 54B of array portion 20a, are shown in the plan view in FIG. 2c; overlying field plate 58 (see FIG. 2a) is not illustrated, for the sake of carity. In this example, word lines formed of gate structures 10A through 10C are perpendicular to bit fine 46, each disposed below capacitor plates 54A, 54B. Capacitor plates 54A, 54B connect to the underlying source/drain regions 7A, 7G, respectively, by way of plugs 35A, 35B and the corresponding contacts. Bit line 46 connects to source/drain region 7C by way of bit line contact BLC, a s illustrated in FIG. 2c. As such, the word line formed by gate structure 10A controls conduction between capacitor plate 45A and bit line 46, and the word line formed by gate structure 10B controls conduction between capacitor plate 54B and bit line 46. Gate structure 10C serves as a word line for other cells not shown in FIG. 2c. Of course, array portion 20a will have many more storage cells than the pair shown in FIG. 2c, similarly accessed by word lines and bit lines as in the case of those illustrated in FIG. 2c.

Figure 3A:
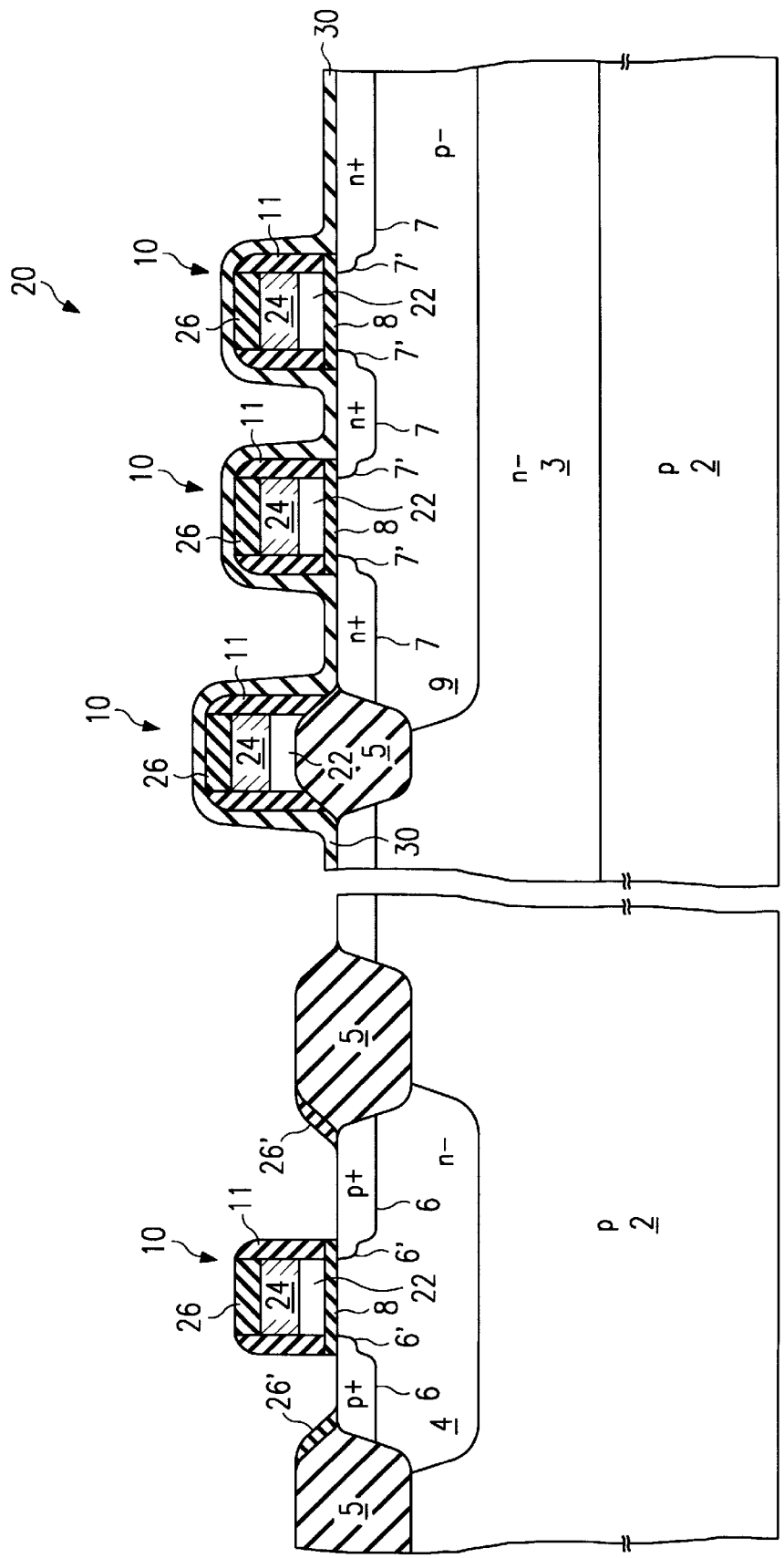

Referring now to FIGS. 3a through 3k, a process for fabricating integrated circuit 20 according to the preferred embodiment of the present invention will now be described in detail. FIG. 3a illustrates the partial construction of integrated circuit 20, up through the formation of transistor source, drain, and gate structures. Prior to the point in the manufacturing process illustrated in FIG. 3a, similarly as in FIG. 1 described hereinabove, field oxide structures 5 are formed by way of LOCOS, with silicon nitride masking (not shown in FIG. 3a) defining the locations and sizes of the active regions and field oxide structures 5. Also in this example, gate structures 10 are formed as layered structures, including polysilicon layer 22 in contact with gate oxide 8, tungsten silicide layer 24 overlying polysilicon layer 22, and silicon nitride layer 26 overlying tungsten silicide layer 24. Each of polysilicon layer 22, tungs silicide layer 24, and silicon nitride layer 26 are deposited by way of CVD, and are then etched to the desired pattern, preferably by first defining a pattern using conventional photolithography to protect nitride layer 26 at the gate structure locations, and then etching nitride layer 26. The remaining portions of nitride layer 26 serve as a hard mask during the etching of tungsten silicide layer 24 and polysilicon layer 22.

Following definition of gate structures 10, light "reach-through" implants are performed in a self-aligned manner relative to gate structures 10 to define source/drain extensions 6' (for p-channel devices), 7' (for n-channel devices), prior to the formation of sidewall filaments 11 along the sides of gate structures 10. According to the preferred embodiment of the invention, sidewall filaments 11 are formed by first oxidizing the sides of polysilicon layer 22. A layer of silicon nitride is then deposited overall, and then etched anisotropically to remove the nitride from flat surfaces, leaving sidewall filaments 11 behind. As noted above, silicon nitride residue 26' may remain along the sides of field oxide structures 5, as these structures also extend above the surface of substrate 2 and have slight sidewalls.

Following formation of sidewall filaments 11, source/drain implant and anneal is performed to form source/drain regions 6 (p+ type), 7 (n+ type). Source/drain regions 6, 7 are formed in a self-aligned manner relative to gate structures 10, in the conventional manner. Following the formation of source/drain regions 6, 7, gate oxide layer 8 is removed overall, except from under gate structures 10. After this etch, integrated circuit 20 has the construction illustrated in FIG. 3a.

Figure 3B:
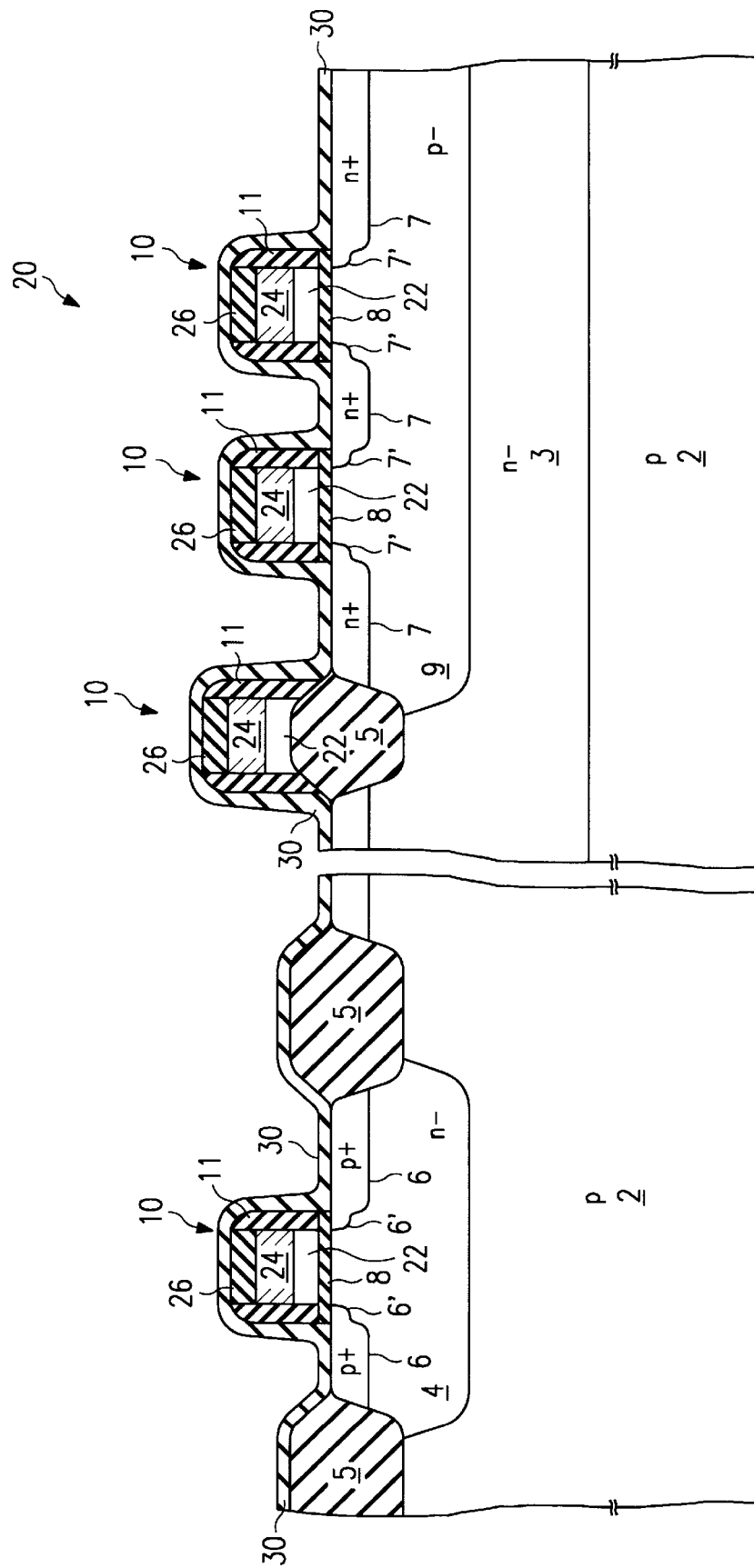

According to the preferred embodiment of the invention, silicon nitride layer 30 is now formed overall, preferably by way of low-pressure chemical vapor deposition (LPCVD), resulting in the structure illustrated in FIG. 3b. Nitride layer 30, as mentioned above and as described hereinbelow, will serve as a dopant barrier to boron and phosphorous residing in subsequently deposited doped silicon dioxide. It is preferred that nitride layer 30 be as thin as possible to minimize its etch time; however, nitride layer 30 must be sufficiently thick to have full integrity over the topography present in integrated circuit 20 to present a good barrier to dopant diffusion. In this embodiment of the invention, the thickness of nitride layer 30 may range from 65Å to 250 Å; the illustration of nitride layer 30 in FIG. 3b and the succeeding Figures is therefore not necessarily to scale.

Figure 3C:
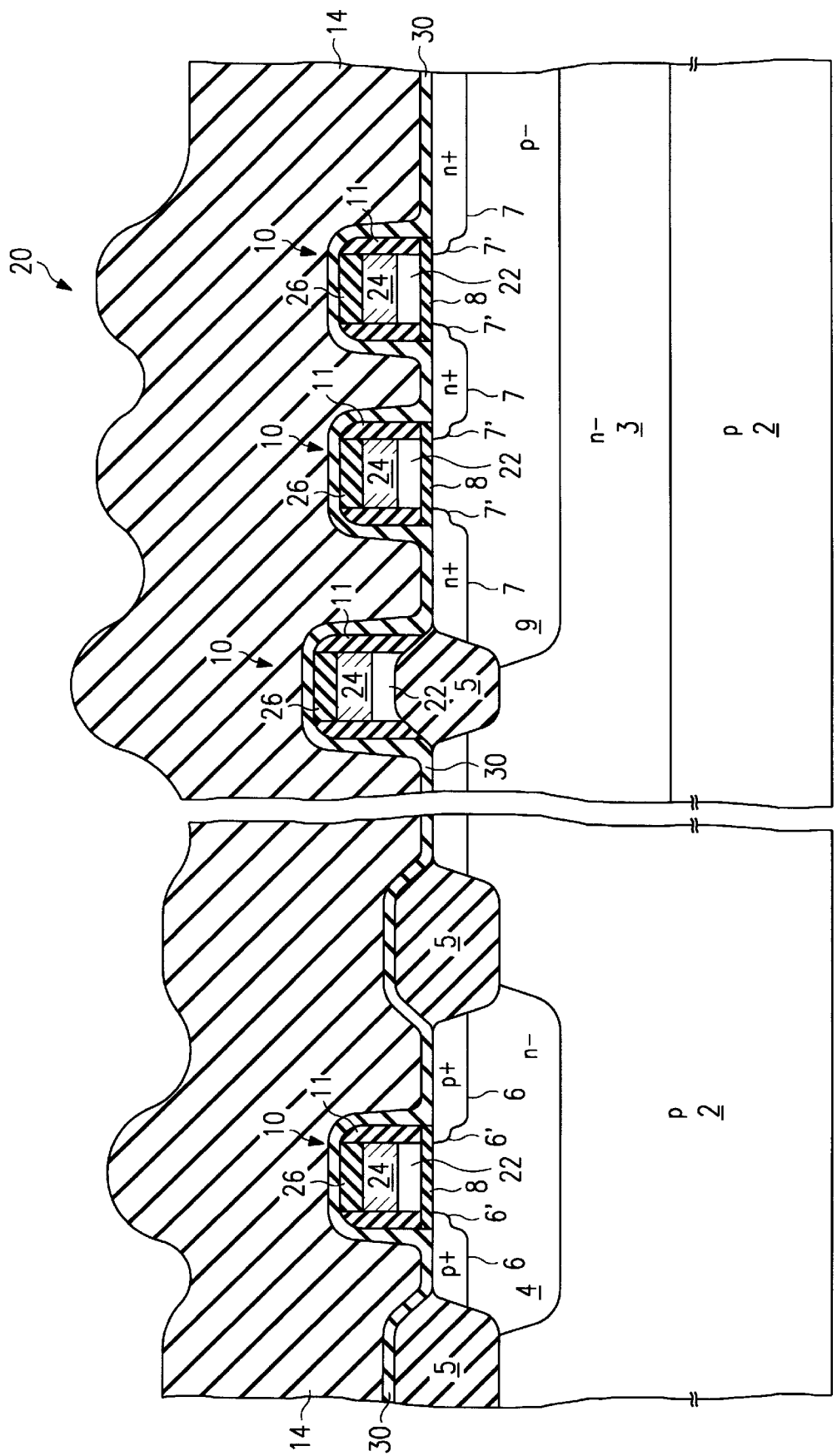

Referring now to FIG. 3c, integrated circuit 20 is. illustrated after the deposition of doped BPSG silicon dioxide layer 14. BPSG layer 14 is preferably deposited in the conventional manner, for example by way of LPCVD, doped with both boron and phosphorous. As is well known in the art, the presence of boron and phosphorous dopant permits reflow of BPSG layer 14 upon a subsequent high temperature anneal This reflow not only serves to planarize BPSG layer 14, but also serves to densify layer 14 and thus improve its integrity. In this exemplary embodiment of the invention, BPSG layer 14 is deposited to a thickness of on the order of 5000 Å, and is then annealed at 850° C. for thirty minutes, in nitrogen ambient, for reflow and densification.

According to the preferred embodiment of the invention, nitride layer 30 provides the important benefit of blocking boron and phosphorous from diffusing into source/drain regions 6,7, not only during the reflow and densification anneal for BPSG layer 14 itself, but also during any high temperature processing subsequent to deposition of BPSG layer 14. The diffusion barrier provided by nitride layer 30 thus prevents counterdoping or overdoping of source/drain regions 6, 7 (depending upon whether the diffusing species is of the same or different conductivity type as that of the region 6, 7 into which the diffusing species diffuses), either of which deleteriously affects the performance of the transistors. The diffusion of dopant from BPSG layer 14 is especially undesirable in high-density integrated circuits, such as integrated circuit 20 in which the junction depths of source/drain regions 6, 7 are on the order of $0.30\mu$, because even small amounts of additional dopant can greatly increase junction capacitance and source/drain resistance of these devices.

In addition, the prevention of diffusion by barrier layer 30 also ensures that BPSG layer 14 itself is of high integrity. As discussed above, BPSG films from which significant amounts of phosphorous have diffused can develop voids from such diffusion. These voids reduce the structural integrity of the film, and can also cause defects in the finished integrated circuit either by permitting short circuits therethrough or by causing steps in the topography of its upper surface that cause discontinuities in overlying conductive films.

Figure 3D:
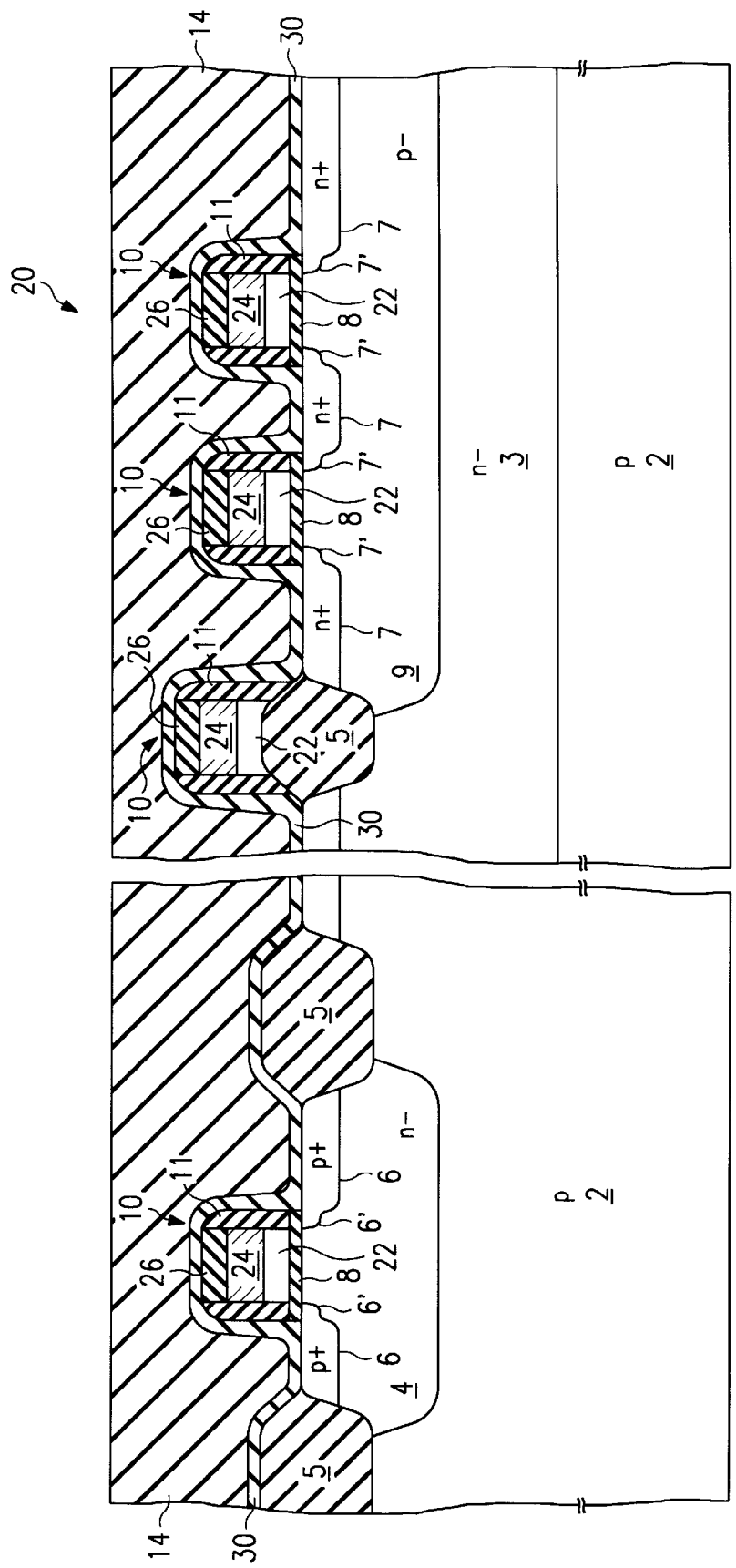

Following deposition and anneal, a planarization etchback of BPSG layer 14 is performed according to this preferred embodiment of the invention. This etchback is performed without patterning, and is preferably a timed etch selected so that BPSG layer 14 remains over the top of all underlying structures. An example of the etchback process is a simple wet etch in buffered hydrofluoric add to leave on the order of 500 Å of BPSG layer 14 over the top of the uppermost gate structure. A cross-sectional view of the resulting structure after etchback is illustrated in FIG. 3d. As evident from FIG. 3d, the upper surface of BPSG layer 14 is substantially planar, and is therefore particularly useful to support additional conductive layers, such as polysilicon, refractory metal, or aluminum metallization.

In this exemplary embodiment of the present invention, as noted above, integrated circuit 20 is a DRAM in which storage capacitors are formed above the active devices; as these storage capacitors are to make contact to source/drain regions 7, contact openings must therefore be made through BPSG layer 14 and nitride layer 30 at the appropriate locations. Of course, other contacts to source/drain regions 6, 7 are necessary to interconnect the transistors of integrated circuit 20, as in any integrated circuit (including not only DRAMs, but also logic circuitry, memories of other types, and the like). The formation of such contact openings according to the preferred embodiment of the present invention will now be described relative to FIGS. 3e through 3g.

Figure 3E:
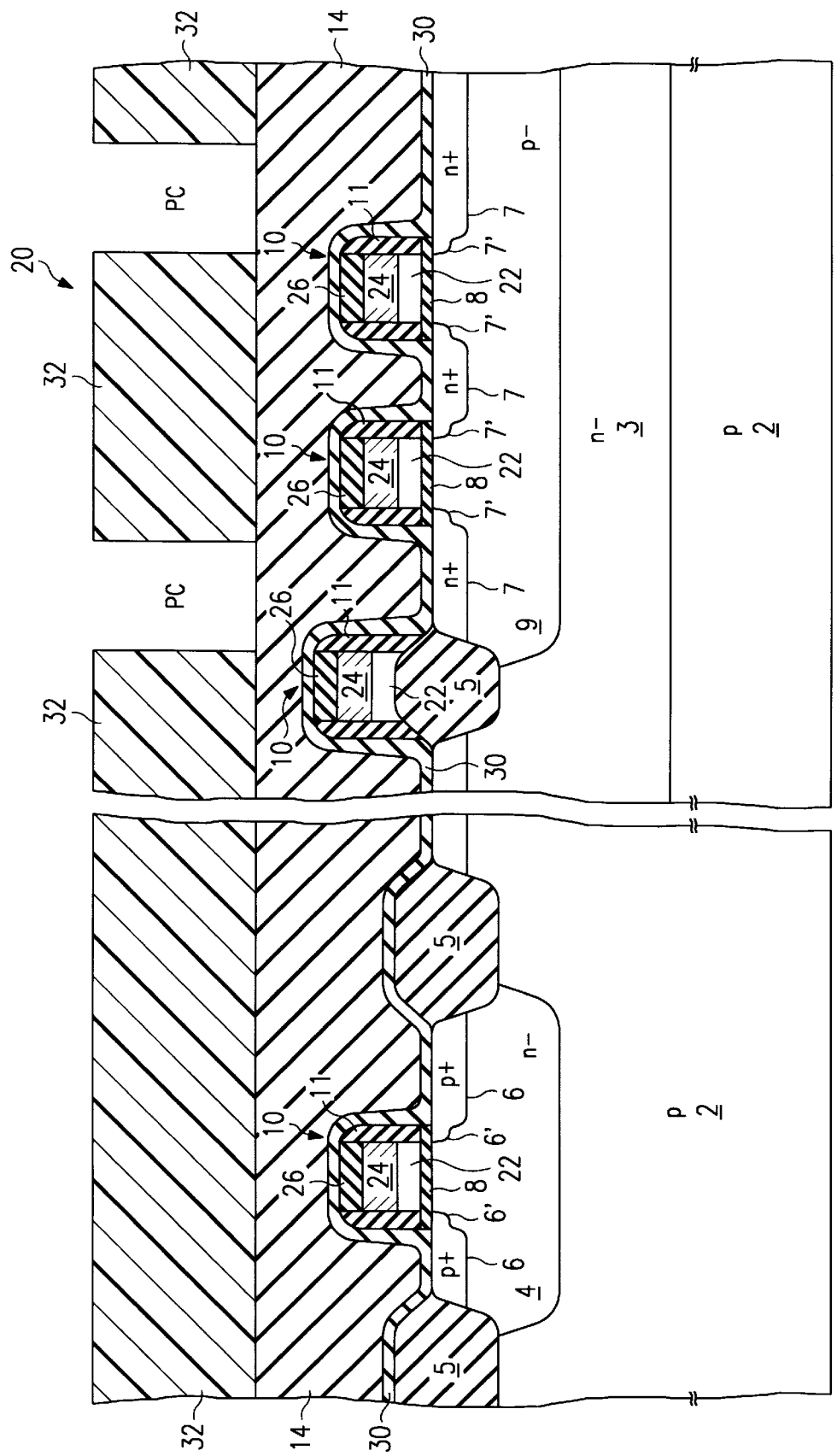

Contact opening locations are defined by way of conventional photolithography. FIG. 3e illustrates patterned photoresist layer 32, after exposure and development to define plug contact openings PC, at those locations where photoresist has been removed after development The remaining portions of photoresist layer 32 serve, of course, as a mask for etch of the contact openings through BPSG layer 14 and nitride layer 30.

Figure 3F:
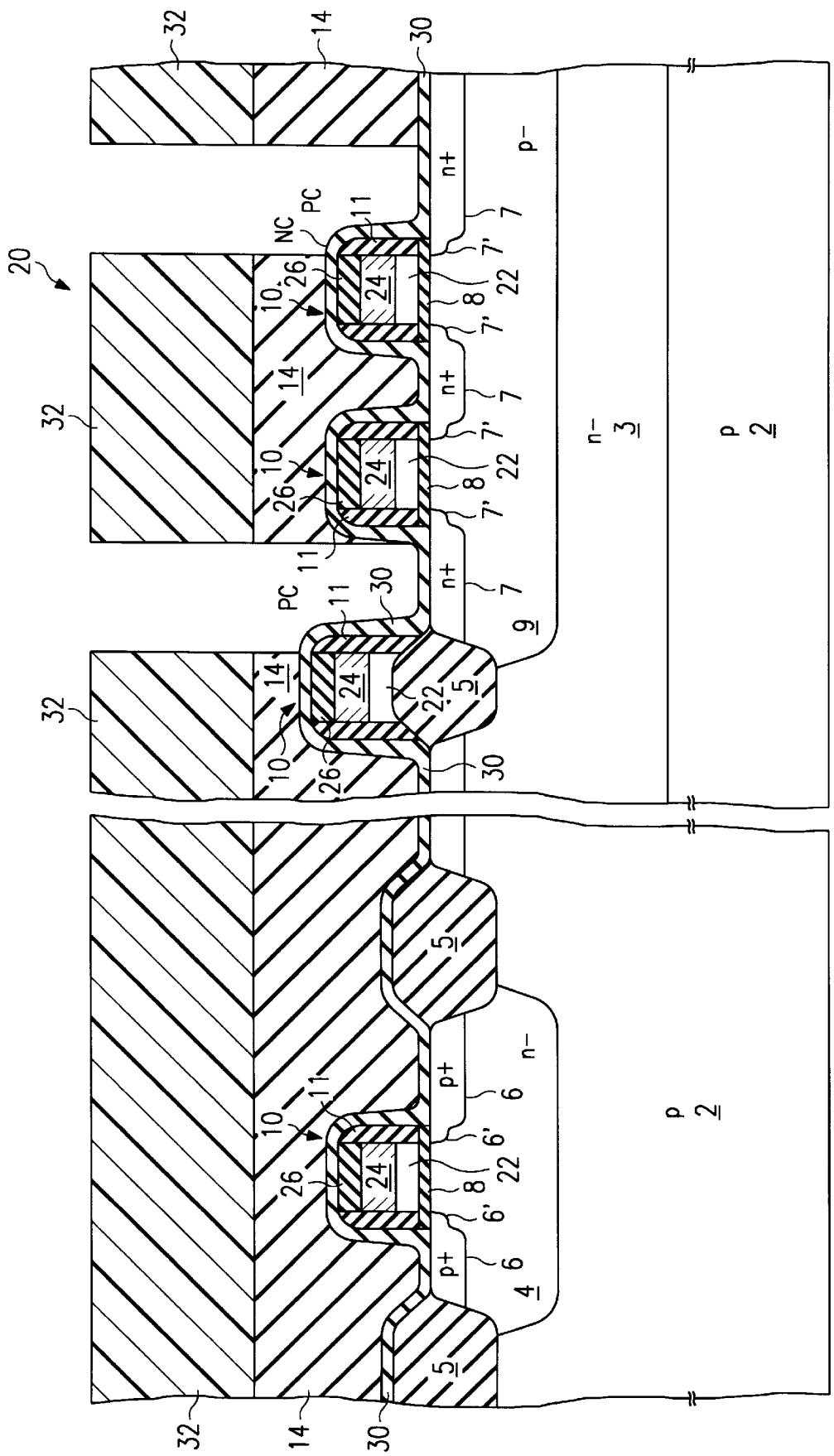

According to this preferred embodiment of the present invention, etching of contact openings through BPSG layer 14 and nitride layer 30 is performed by way of a two-step etch. The first step is a "dry" etch of BPSG layer 14, carried out in a plasma etch reactor as known in the art, a preferred example of which is the TEL DRM reactor. In this preferred example, this first etch step is performed at a nominal pressure of 35 mtorr, at a nominal power level of 1700 watts, at a chamber temperature of 60° C., and at an electrode (and wafer) temperature of 20° C.; tolerance limits for each of these parameters is on the order of ±10%. The chemical species of the etch of BPSG layer 14 according to this preferred embodiment includes $C_4F_8$ at 10 sccm (±10%), CO at 240 sccm (±10%), and argon at 320 sccm (10%). Under these conditions, etching of BPSG layer 14 is relatively highly selective relative to etching of nitride layer 30, and as such the etch will tend to stop on nitride layer 30. While the time required to perform this etch will vary with the thickness of BPSG layer 14 at plug contact openings PC, typical etch times for this first step will be on the order of 75 seconds. FIG. 3f illustrates integrated circuit 20 following the completion of the first step of this two-step etch.

Figure 3G:
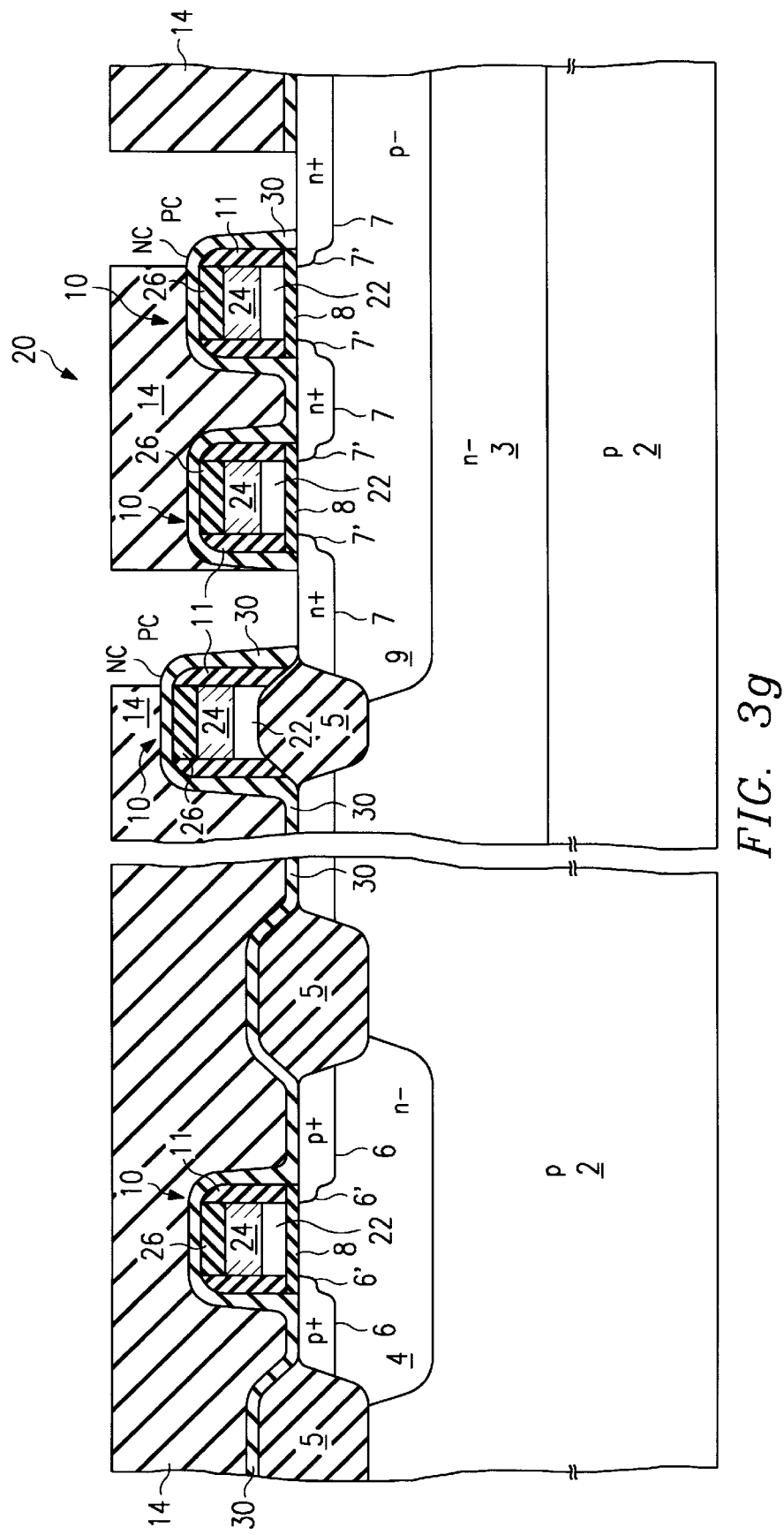

As illustrated in FIG. 3f, nitride layer 30 remains within plug contact openings PC after the first step of the two-step etch. As nitride layer 30 is relatively thin, as described above, the second etch step of this process is a relatively brief etch under. similar pressure, power, and temperature conditions as the first etch step. The active species in the second step of the two-step etch preferably include $CHF_3$ at 50 sccm (10%) in combination with CO at 175 sccm (±10%). This second step is preferably a timed etch, with a duration of on the order of 10 seconds. FIG. 3g illustrates the construction of integrated circuit 20 after the completion of both etch steps, and the stripping of photoresist layer 32.

This etch will also dear any nitride residue 26' at the margins of field oxide structures 5, as shown in FIG. 3a, that may be within plug contact openings PC.

It has been observed, in connection with the present invention, that the two-step etch of BPSG layer 14 and nitride layer 30 is particularly beneficial, as damage to the corners of gate structures 10 and sidewall filaments 11 is substantially minimized. In particular, sidewall corner locations NC illustrated in FIG. 3g have been observed to be particularly susceptible to damage from conventional nitride. etches. However, the brief nitride etch used to clear nitride layer 30 from within plug contact locations PC has been observed to be highly anisotropic, and because of this anisotropy in combination with its brevity, minimizes damage at the sidewall comer locations NC of gate structures 10 in integrated circuit 20.

Figure 3H:
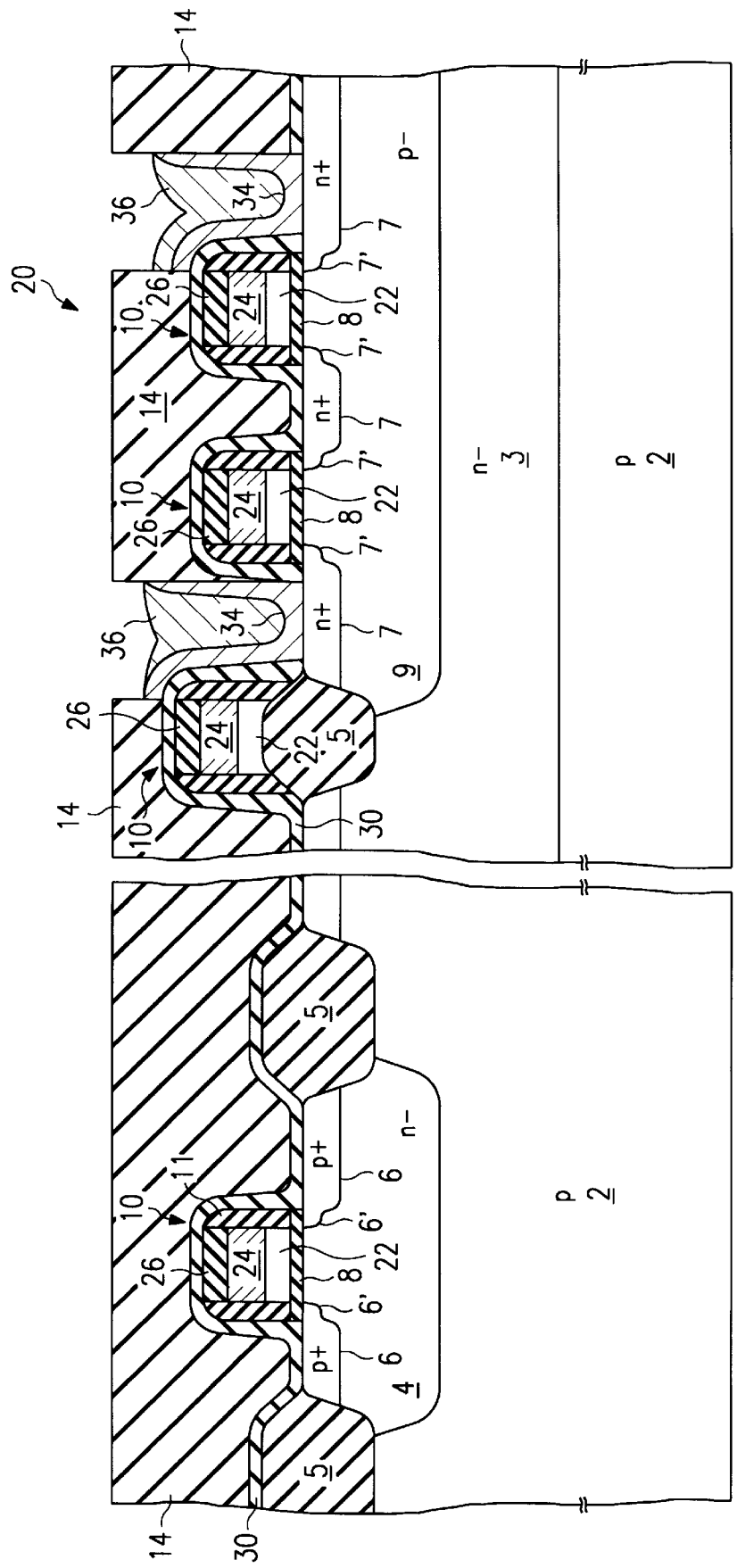

Following definition of plug contact openings PC, polysilicon plugs are formed therewithin, in contact with source/drain regions 7 as illustrated in FIG. 3h. In this embodiment of the invention, polysilicon plugs are formed as two layers of polysilicon; first polysilicon layer 34 is preferably highly n-type doped polysilicon, deposited to a thickness of on the order of 500 Å, and second polysilicon layer 36 is lightly-doped or undoped polysilicon, deposited to a thickness of on the order of 5000 Å to fill plug contact openings PC. An unmasked polysilicon etchback is then performed to remove polysilicon layers 34, 36 from the top surface of BPSG 14, leaving polysilicon plugs 34, 36 (plugs 35 as shown in FIG. 2a) within plug contact openings as shown in FIG. 3h.

Figure 3I:
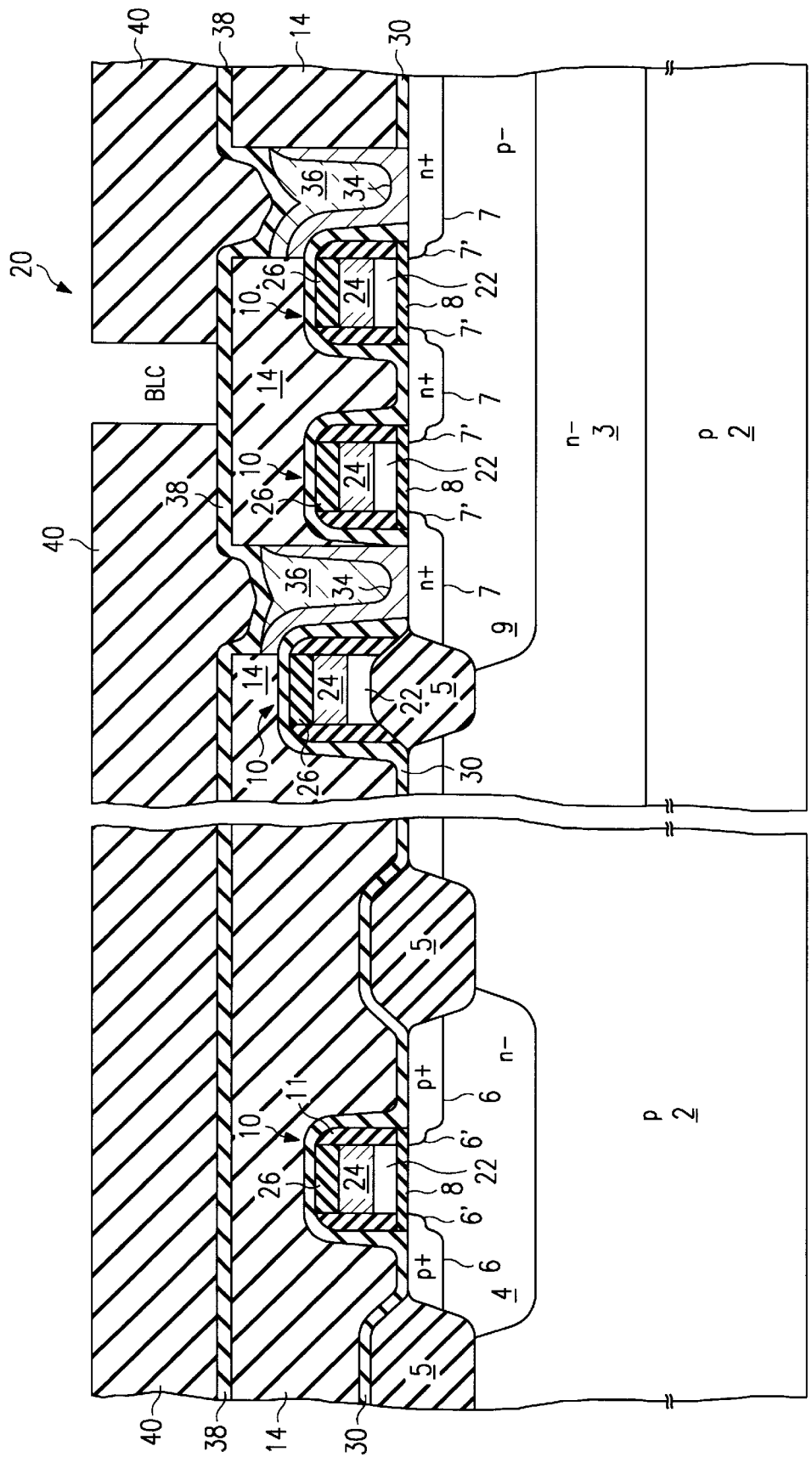

Once plugs 34, 36 are in place as illustrated in FIG. 3h, additional processing continues as desired for the formation of integrated circuit 20. In this example, where integrated circuit 20 serves as a DRAM, the formation of bit line contacts is necessary. Referring to FIG. 3i, plug oxide layer 38 is disposed overall to a thickness on the order of 1000 Å, including over polysilicon plugs 34, 36. Photoresist layer 40 is then disposed overall, and patterned to define bit line contact location BLC as shown.

Figure 3J:
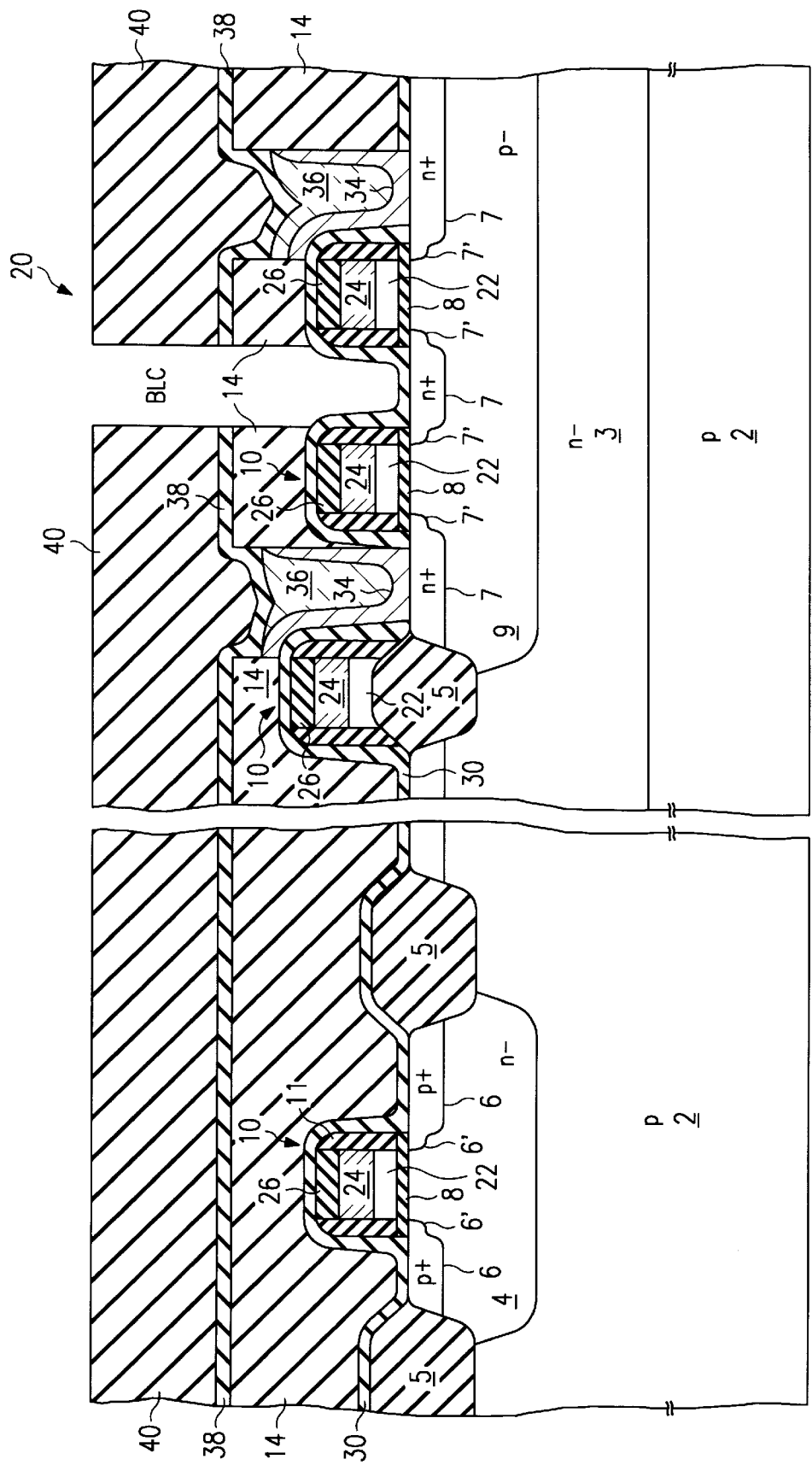

As in the formation of plug contact locations PC, bit line contact location BLC is formed by way of a two-step etch. The first step of this two-step etch is an oxide etch, to etch plug oxide layer 38 and BPSG layer 14 at bit line contact location BLC. This first plasma etch step is carried out under similar conditions as the etch of BPSG layer 14 at plug contact locations PC as described hereinabove relative to FIG. 3f, namely at a nominal pressure of 35 mtorr (±10%), a nominal power level of 1700 watts (±10%), and at chamber and electrode temperatures of 60° C. and 20° C., respectively, using $C_4F_8$ at 10 sccm (±10%), CO at 240 sccm (±10%), and argon at 320 sccm (±10%). The duration of this first step is on the order of 85 seconds, as both BPSG layer 14 and plug oxide layer 38 are to be etched at this point As before, under these conditions the etching of BPSG layer 14 is relatively highly selective relative to etching of nitride layer 30, and as such the etch will again tend to stop on nitride layer 30. As described above, nitride layer 30 protects the surface of source/drain region 7 from ionized oxygen that is released in the etch of BPSG layer 14 in bit line contact location BLC. FIG. 3j illustrates integrated circuit 20 following the completion of the first step of this two-step etch.

Figure 3K:
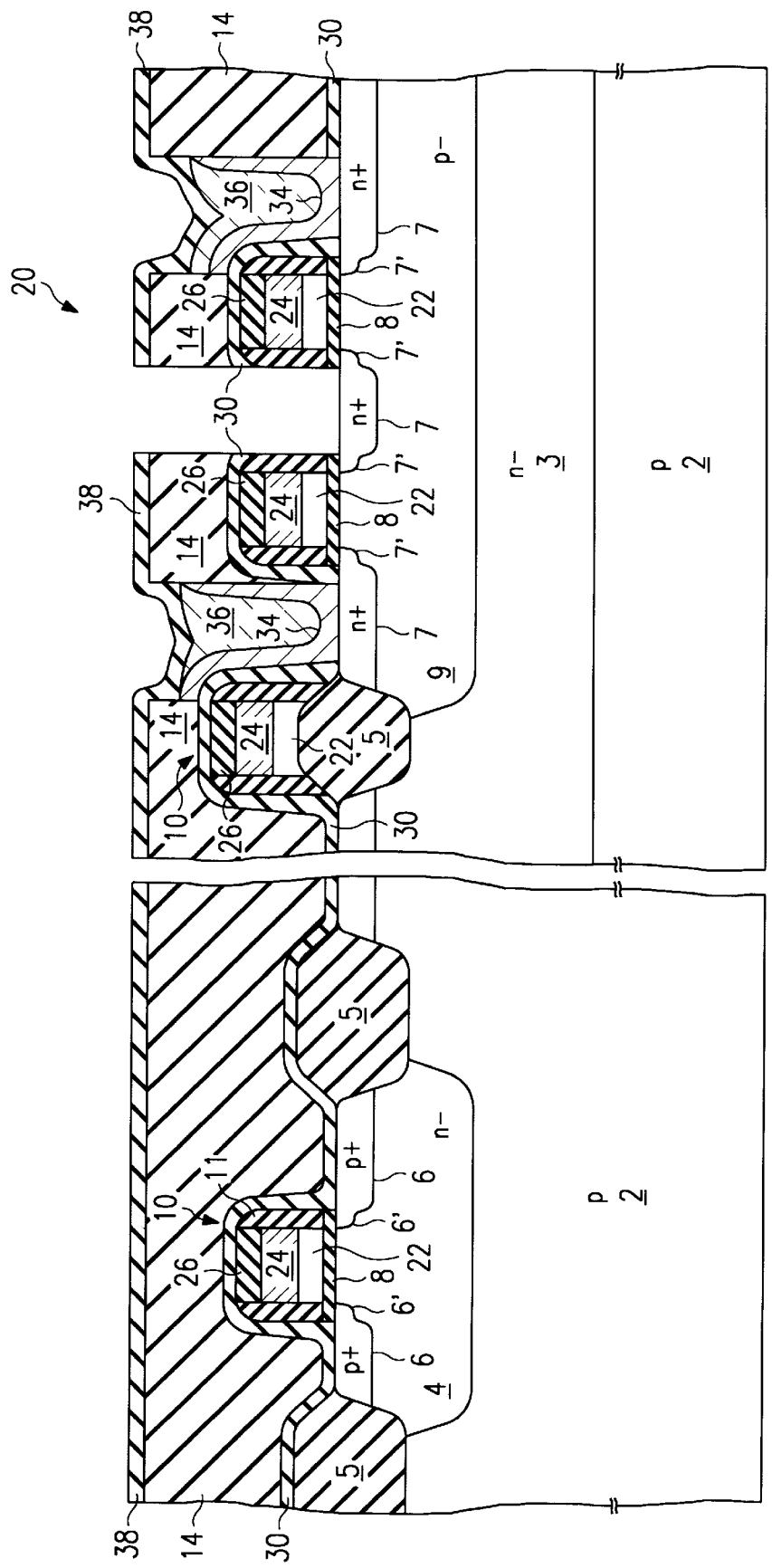

The second step of the two-step etch is then performed, to remove nitride layer 30 from bit line contact location BLC. This second step is substantially identical to that performed in the two-step etch of plug contact locations PC, which is a relatively brief etch under similar pressure, power, and temperature conditions as the first etch step. As before, the active species in the second step of the two-step etch preferably include $CHF_3$ at 50 sccm (±10%) in combination with CO at 175 sccm (±10%). This second step is also preferably a timed etch, having a duration of on the order of 10 seconds. FIG. 3k illustrates integrated circuit 20 after the completion of the two-step etch of BPSG layer 14 and nitride layer 30, showing the clearing of the surface of source/drain region 7 within bit line contact opening BLC.

Following the opening of bit line contact opening BLC as illustrated in FIG. 3k, integrated circuit 20 is further processed to form the remaining elements, such as crown storage capacitor plates 54, 58 with capacitor dielectric 56 therebetween, metal conductors 52, overlying insulating layers 48, 49, and the like, as illustrated in FIG. 2aIn particular, the etching through insulating layers 49, 38, BPSG layer 14, and nitride layer 30 may be performed by way of a single step etch, rather than a two-step etch as described hereinabove, where spacing permits as illustrated in the example of FIG. 2a.

As described hereinabove, the present invention provides many important advantages in the fabrication of integrated circuits, particularly those of high density and small feature sizes. Firstly, diffusion of dopant from overlying doped silicon dioxide layers, and into active regions, is prevented through the use of an underlying nitride layer according to the present invention. This barrier to dopant diffusion maintains high performance active devices, and prevents voiding in the overlying doped oxide layer that can result from excessive phosphorous out-diffusion. Secondly, the underlying nitride layer enables the use of a two-step etch for which an etch stop is provided for the first, oxide etch, step, but also in which the etching of the nitride layer may be performed in such a manner as to not damage any exposed sidewall filaments. The presence of the nitride layer during the oxide etch also provides the important benefit of protecting the surface of the active region from damage due to ionized oxygen that is released during oxide etch.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A method of fabricating an integrated circuit, comprising the steps of:

forming active device structures at a surface of a semiconducting body, the active device structures including doped regions at said surface of said semiconducting body;

depositing a dopant diffusion barrier layer of silicon nitride over the active device structures and in contact with said surface of the semiconducting body;

depositing a heat planarizable layer comprising doped silicon dioxide over and in contact with the silicon nitride layer;

then heating the device structures to cause concurrent annealing the structures and planarization of said heat planarizable layer;

then plasma etching selected locations of the heat planarized layer with a first etchant that selectively etches the heat planarized layer relative to silicon nitride to expose portions of the silicon nitride layer at the selected locations;

then plasma etching the exposed portions of the silicon nitride layer with a second etchant to expose and provide openings to portions of the active device structures; and forming conductive connections to the active device structures through the etched openings in the planarized layer and the silicon nitride layer.

2. The method of claim 1 further comprising: after the step of heating the device structures, performing an etchback of the planarized layer to form a substantially planar upper surface thereof.

3. The method of claim 1, wherein the heat planarizable layer is doped with phosphorous.

4. The method of claim 1, wherein the heat planarizable layer is doped with boron.

5. The method of claim 1, wherein the heat planarizable layer is doped with boron and phosphorous.

6. The method of claim 1, wherein the step of forming active device structures comprises:

forming isolation oxide structures at selected locations of the surface;

forming gate structures at selected locations of the surface to define source/drain regions at locations between the gate structures and the isolation oxide structures; and doping the source/drain regions in a self-aligned manner relative to the gate structures.

7. The method of claim 1, wherein the first etchant comprises a mixture of $C_4F_8$, CO, and argon.

8. The method of claim 2, wherein the second etchant comprises $CHF_3$ and CO.

9. The method of claim 1, further comprising:

forming memory storage capacitors in contact with at least some of the conductive connections through the etched opening.

10. The method of claim 9, further comprising:

after the step of forming conductive connections, etching a second plurality of selected locations of the heat planarized layer with an etchant that selectively etches silicon dioxide relative to silicon nitride to expose portions of the silicon nitride layer at the second plurality of selected locations;

then etching the exposed portions of the silicon nitride layer to expose a second plurality of portions of the active device structures; and forming memory bit lines in contact with at least some of the second plurality of portions of the active device structures.

11. A method of fabricating an integrated circuit, comprising the steps of:

forming active device structures at a surface of a semiconducting body, the active device structures including doped regions at said surface of said semiconducting body;

depositing a dopant diffusion barrier layer of silicon nitride over the active device structures and in contact with said surface of the semiconducting body for prevention of dopant migration therethrough;

depositing a heat planarizable layer comprising doped silicon dioxide over and in contact with the silicon nitride layer, the dopant diffusion barrier layer preventing migration of the dopant in said silicon oxide therethrough;

then heating the device structures to cause annealing and planarization of said heat planarizable layer while preventing said dopant from migration into said active device structures;

then plasma etching selected locations of the heat planarized layer with a first etchant that selectively etches the heat planarized layer relative to silicon nitride to expose portions of the silicon nitride layer at the selected locations;

then plasma etching the exposed portions of the silicon nitride layer with a second etchant to expose and provide openings to portions of the active device structures; and forming conductive connections to the active device structures through the etched openings in the planarized layer and the silicon nitride layer.

12. The method of claim 11 further comprising: after the step of heating the device structures, performing an etchback of the planarized layer to form a substantially planar upper surface thereof.

13. The method of claim 11, wherein the heat planarizable layer is doped with phosphorous.

14. The method of claim 11, wherein the heat planarizable layer is doped with boron.

15. The method of claim 11, wherein the heat planarizable layer is doped with boron and phosphorous.

* * * * *

UNITED STATES PATENT AND TRADEMARK OFFICE
CERTIFICATE OF CORRECTION

PATENT NO.     : 6,277,720 B1
DATED          : August 21, 2001
INVENTOR(S)    : Vikram N. Doshi and Ming Yang It is certified that error appears in the above-identified patent and that said Letters Patent is hereby corrected as shown below:

<u>Title page,</u>
Item [57], ABSTRACT,
Line 19, replace "comer" with -- corner --

<u>Column 1,</u>
Line 52, replace "metalliation" with -- metallization --
Line 61, insert -- . -- after "circuit"

<u>Column 2,</u>
Line 31, replace "disilcide" with -- disilicide --
Line 35, delete "." between "to" and "gate"
Line 37, replace "include" with -- includes --

<u>Column 3,</u>
Line 2, replace "source/dram" with -- source/drain --
Line 14, replace "to" with -- by --
Line 21, replace "500 A" with -- 500 Å --

<u>Column 4,</u>
Line 17, delete "." between "doped" and "oxide"

<u>Column 5,</u>
Line 48, delete "." between "another" and "by"

<u>Column 6,</u>
Line 60, replace "Will" with -- will --
Line 65, replace "2p" with -- 20p --

<u>Column 7,</u>
Line 1, delete "." after "As"
Line 8, delete ":" between "for" and "connection"
Line 13, replace "carity" with -- clarity --
Line 15, replace "bit fine" with -- bit line --
Line 17, replace "7G" with -- 7B --
Line 19, replace "a s" with -- as --
Line 22, replace "45A" with -- 54A --
Line 44, replace "tungs" with -- tungsten --

UNITED STATES PATENT AND TRADEMARK OFFICE
CERTIFICATE OF CORRECTION

PATENT NO. : 6,277,720 B1
DATED : August 21, 2001
INVENTOR(S) : Vikram N. Doshi and Ming Yang It is certified that error appears in the above-identified patent and that said Letters Patent is hereby corrected as shown below:

Column 8,
Line 23, delete "." after "is"
Line 31, after "anneal" insert -- . --

Column 9,
Line 5, replace "add" with -- acid --
Line 31, after "development" insert -- . --
Line 47, replace "10%" with -- ±10% --
Line 60, delete "." after "under"
Line 63, replace "10%" with -- ±10% --

Column 10,
Line 1, replace "dear" with -- clear --
Line 11, delete "." after "nitride"
Line 15, replace "comer" with -- corner --

Column 11,
Line 16, insert -- . -- after "FIG 2a"
Line 66, delete "the structures"

Signed and Sealed this

Twenty-first Day of January, 2003

JAMES E. ROGAN
*Director of the United States Patent and Trademark Office*